United States Patent [19]

Nishigaki et al.

[11] Patent Number: 4,766,085
[45] Date of Patent: Aug. 23, 1988

[54] METHOD OF MANUFACTURING CONTACT TYPE ONE-DIMENSIONAL IMAGE SENSOR

[75] Inventors: Satoshi Nishigaki, Nara; Ryusuke Kita, Tenri; Shuhei Tsuchimoto, Nara; Akiteru Rai, Osaka; Masaru Iwasaki, Izumisano; Yuzi Matsuda, Yao; Takashi Nukii, Nara, all of Japan

[73] Assignee: Sharp Kabushiki Kaisha, Osaka, Japan

[21] Appl. No.: 894,051

[22] Filed: Aug. 7, 1986

[30] Foreign Application Priority Data

Aug. 7, 1985 [JP] Japan ................. 60-174525
Sep. 18, 1985 [JP] Japan ................. 60-207981
Sep. 18, 1985 [JP] Japan ................. 60-207982

[51] Int. Cl.⁴ .............................................. H01L 31/04
[52] U.S. Cl. .......................................... 437/3; 437/5; 437/51
[58] Field of Search ............... 437/2, 3, 5, 51, 185, 437/205, 207, 228, 234; 357/30 B, 30 G, 30 H, 30 Q

[56] References Cited

U.S. PATENT DOCUMENTS 4,660,277 4/1987 Tei ............................ 437/2

FOREIGN PATENT DOCUMENTS 59-204266 11/1984 Japan ..................... 357/30
60-182179 9/1985 Japan ..................... 437/3

Primary Examiner—Aaron Weisstuch
Attorney, Agent, or Firm—Birch, Stewart, Kolasch & Birch

[57] ABSTRACT

A method for manufacturing a contact type one-dimensional image sensor, which includes the step of providing a light receiving element portion composed of one or more of Group II-VI compounds semiconductor containing Cd on a substrate, and also providing a matrix wiring portion on the same substrate as that of the light receiving element portion, and the method is characterized by the step of forming an insulating layer for the formation of the matrix wiring portion in such a manner as to cover the light receiving element portion.

9 Claims, 5 Drawing Sheets

METHOD OF MANUFACTURING CONTACT TYPE ONE-DIMENSIONAL IMAGE SENSOR

BACKGROUND OF THE INVENTION

The present invention generally relates to an image sensor and more particularly, to a method of manufacturing a contact type one-dimensional image sensor which is provided with a photoconductive material composed of a Group II-VI compound semiconductor containing Cd, or more than two kinds of such compound semiconductor as a photoelectric converting film, employing a real time reading system and a matrix wiring drive, and also relates to a contact type image sensor module substrate produced by such method.

For manufacturing a photoelectric converting film of a long length or of a large area, there have conventionally been employed various thin film preparing techniques such as a vacuum deposition method, sputtering method or glow discharge chemical vapor deposition method, etc.

Furthermore, in order to improve resistance against environmental conditions of the element using the photoelectric converting film prepared through employment of the thin film manufacturing techniques as described above, protection of the photoelectric converting film has been effected by various organic resin films or inorganic insulating films.

In the conventional thin film manufacturing techniques as described so far, film characteristics depend on manufacturing techniques of production apparatuses to a large extent, and there are still problems to be solved in the aspects of yield and reliability. For example, in the case where amorphous silicon thin films are to be produced by the reactive sputtering method or glow discharge vapor growth method, etc., techniques of a high degree are required for the control of glow discharge and plasma, and thus, it becomes rather difficult to achieve uniformity in the reproducibility and film characteristics.

Meanwhile, for producing a thin film of a Group II-VI compound semiconductor containing Cd by the sputtering method or vacuum deposition method, etc., deviation from stoichiometric composition delicately varies according to the manufacturing conditions, and there has been such a serious disadvantage that a sufficient reproducibility can not be achieved, depending on the manufacturing conditions, in the activating treatment by doping of halogen compounds such as of Cd, Cu, and Ag, etc. for imparting photoconductivity.

Moreover, in the conventional element manufacturing methods, cost tends to be increased since an extra process is required for the formation of the protective film for the element.

SUMMARY OF THE INVENTION

Accordingly, a primary object of the present invention is to provide a method of manufacturing a contact type one-dimensional image sensor in which the process for preparing the element is simplified, with a simultaneous improvement in the yield in the manufacture of the elements.

A second object of the present invention is to provide a method of forming a contact type image sensor module substrate which is highly reliable and low in cost, through employment of a coplanar contact type image sensor.

A third object of the present invention is to provide a construction of the contact type image sensor of the above described type.

In accomplishing these and other objects, according to the first aspect of the present invention, there is provided a method of manufacturing a contact type one-dimensional image sensor, which includes the steps of providing on a substrate a light receiving element portion composed of a single body of a II-VI compound semiconductor containing Cd, or composed of more than two kinds of such compound semiconductor, and also providing a matrix wiring portion on the same substrate as that for the light receiving element portion, and is characterized by the step of forming an insulating layer for the formation of the matrix wiring portion in such a manner as to cover the light receiving element portion.

In the above method of the present invention, since the insulating layer for the matrix wiring formation is adapted to simultaneously serve as a protective film for the photoelectric conversion film constituting the light receiving element, by providing the light receiving element portion composed of a single body of a Group II-VI compound semiconductor containing Cd or composed of more than two kinds of such compound semiconductor on the same substrate as the matrix wiring forming portion, the manufacturing process of the element is simplified, and moreover, as one preferred embodiment, through employment of an insulative polymeric film for the insulating layer, defects, due to occurrence of pin holes, etc., in the protective film and insulating layer may be reduced as far as possible, with a consequent improvement of yield in the manufacture of the elements.

By the elements manufacturing process of the present invention as described above, owing to the fact that the protective film forming step for the photoelectric converting film is completed at an early stage of the element manufacturing process by the formation of the insulating layer for the formation of the multi-layer wirings, adverse effects to the light receiving element characteristics by various etchants at the later steps such as the through-hole forming step and fine processing step of wiring, etc., may be completely eliminated, and thus, reliability of the characteristics of the element can be markedly improved.

Furthermore, since the organic polymeric material has a dielectric constant smaller than that of the inorganic insulating material and can be readily formed to have film thicknesses of 5 to 10 $\mu$m, by employing the insulative polymeric film for the insulating layer as in the embodiment, it becomes possible to provide less capacitance at the multi-layer wiring portion, thereby causing to not hinder the high speed driving of the element at all. In addition, a film thickness is difficult to achieve using an inorganic insulating material however the film thickness may be easily formed by the organic polymeric material, such that the occurrence of defects such as pin holes and the like is readily prevented for realization of improved yield and cost reduction in the manufacture of elements.

Meanwhile, in the second aspect of the present invention, there is provided a method of forming a coplanar contact type image sensor module substrate, which includes the steps of forming a photoconductor layer and a lower wiring on a substrate, coating an insulating layer between an upper wiring and the lower wiring, with the insulating layer being retained at a semi-cured state, etching the insulating layer in this state to effect a via-hole formation, effecting complete curing of the insulating layer, forming the upper wiring on said insulating layer.

By the above steps of the present invention, a highly reliable image sensor module substrate may be produced at low cost.

Furthermore, in the third aspect of the present invention, a coplanar contact type image sensor module substrate includes a photoconductor layer and a lower wiring formed on a substrate, and an organic resin layer coated at least on the photoconductor layer, with the organic resin layer arranged to provide at least two functions of a multi-layer formation insulating film of a reading circuit portion, a covering film in a process of the photoconductor layer, and the photoconductor layer as an environmental-resistant protective layer.

By the above arrangement of the present invention, an improved contact type image sensor module substrate superior in reliability may be provided at low cost.

BRIEF DESCRIPTION OF THE DRAWINGS

These and other objects and features of the present invention will become apparent from the following description taken in conjunction with the preferred embodiments thereof with reference to the accompanying drawings, in which.

DETAILED DESCRIPTION OF THE INVENTION

Figure 1:
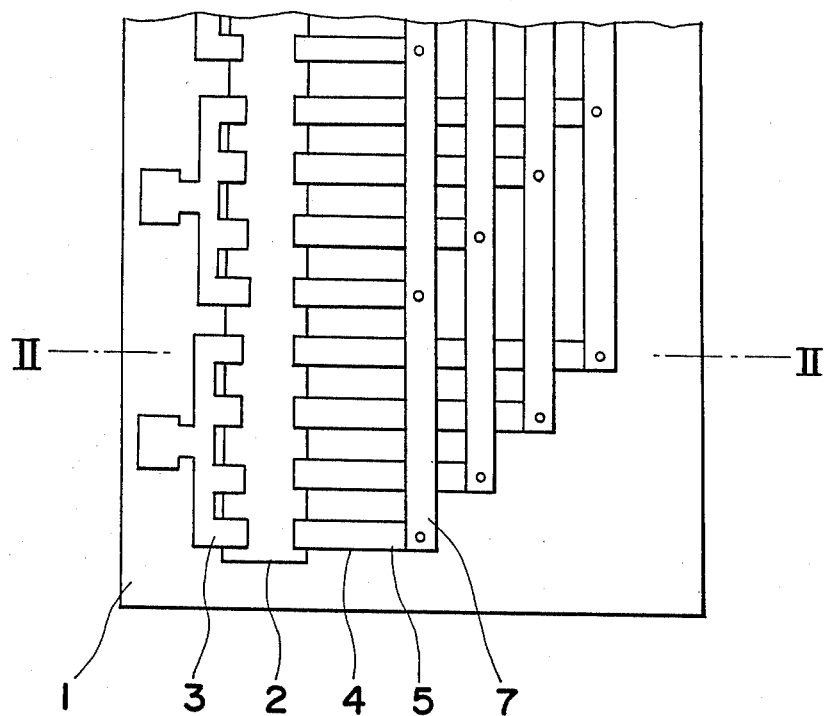
FIG. 1 is a fragmentary top plan view of a contact type one-dimensional image sensor according to one preferred embodiment of the present invention.

Before the description of the present invention proceeds, it is noted that like parts are designated by like reference numerals throughout the accompanying drawings.

Referring now to the drawings, a method of manufacturing a contact type one-dimensional image sensor according to one preferred embodiment of the present invention will be explained with reference to FIGS. 1 to 3.

The material composed of a single body of a Group II-VI compound semiconductor containing Cd or composed of more than two kinds of such compound semiconductor, is prepared by adding as impurities, 0.1 to 1 molar % of $CuCl_2$ and/or $AgCl_2$ to raw powder of said Group II-VI compound semiconductor having an average diameter in the order of about 0.2 $\mu$m and obtained by a known chemical deposition process, with a subsequent sintering thereof for 30 to 60 minutes in an atmosphere of inert gas for an activation treatment so as to impart photoconductivity thereto. The crystalline powder obtained in the manner as described above is employed as a starting material in the embodiments to be described hereinafter.

Figure 2:
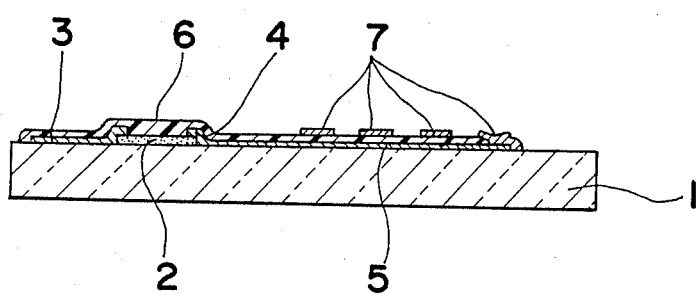
FIG. 2 is a cross section taken along the line II—II in FIG. 1.

As shown in FIG. 1 and FIG. 2 representing a cross section taken along the line II—II in FIG. 1, the element includes in its construction, a photoelectric converting film 2 formed in a stripe configuration on an insulative substrate 1 through a baking step, common electrodes 3 and stripe-like individual electrodes 4 formed to cover opposite side portions of said photoelectric converting film 2, with said individual electrodes 4 being continuously elongated to form a lower wiring 5, an organic insulating layer 6 formed thereon to serve as an insulating film and an element protective film, and an upper wiring 7 further formed thereon, with the electrode wirings being formed in the form of matrix wirings divided into blocks by a plurality of pieces.

For materials of the electrodes 3 and 4 and wirings 5 and 7, Ti or Ta which are high melting point metals with a small work function or alloys thereof are employed for an ohmic contact with the photoelectric converting film 2, and also for the improvement of contact with respect to said photoelectric converting film 2 and the insulative substrate 1. For the insulative substrate 1, a high heat-resistant substrate such as a ceramic substrate, alumina substrate, pyrex glass substrate or the like may be employed. Meanwhile, for the organic insulative layer 6, heat-resistant resins such as polyimide resin, polyamideimide resin or the like should preferably be adopted.

Figure 3:
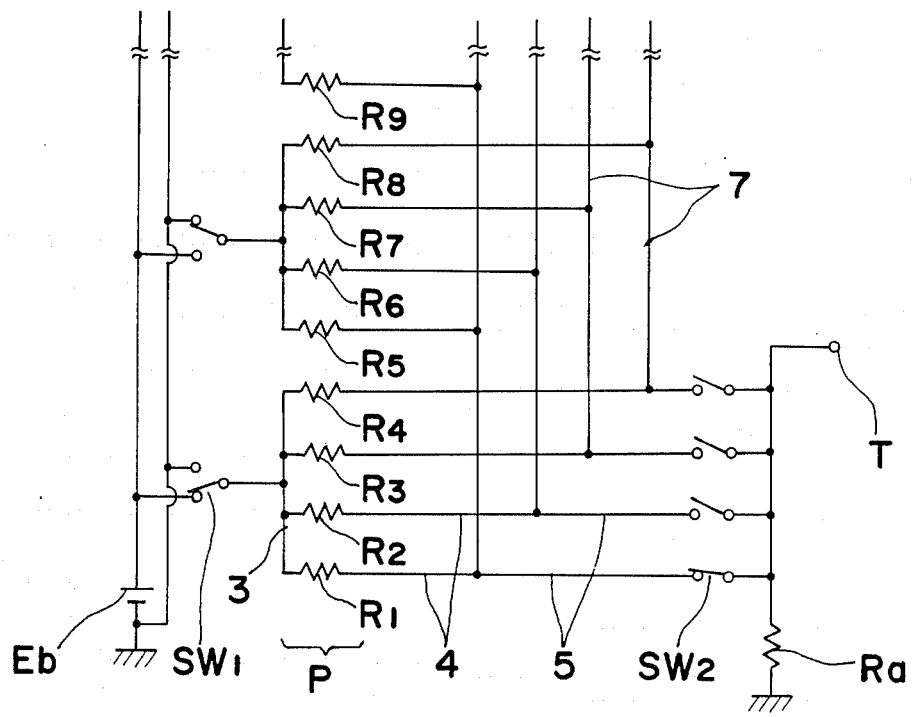
FIG. 3 is an electrical diagram showing a fundamental circuit construction in the case where the contact type one-dimensional image sensor of the present invention is actually used.

Referring particularly to FIG. 3, there is shown an electrical diagram representing fundamental circuit construction in the case where the contact type one-dimensional image sensor prepared according to the present invention is actually used, in which resistances $R_1$, $R_2$, $R_3$, $R_4$, $R_5$, $R_6$, $R_7$, $R_8$, $R_9$, . . . and $R_n$ denote resistances of respective portions between the common electrodes 3 and individual electrodes 4, i.e., element resistances of the image elements (light receiving element array) P, and a DC bias power supply, Eb, is provided to apply voltage to the common electrodes 3 through change-over switches SW1, by the operation of which, each of the common electrodes 3 is connected to the bias DC power supply Eb or to the ground side. The respective individual electrodes 4 are connected, through switches SW2, to a load resistance Ra for outputting a signal to an output terminal T so as to read the signal current as a voltage. These switches SW1 and SW2 are, for example, in the form of switching elements constituted by C-MOS transistors, and arranged to sequentially effect switching functions by gates in the elements connected to a shift register (not shown).

By the above construction, the photoelectric converting film 2 constituting the respective picture elements shows variations in the resistance according to the light amount as received, and since this resistance variation is outputted as signal current by the bias DC power supply Eb, voltages corresponding to the light amount are produced at the output terminal T. Therefore, when the respective picture elements are scanned by the switching of the switches SW1 and SW2, the light receiving element constituting the respective image elements shows the resistance variation corresponding to the received light, and thus, the one-dimensional image information reading signal is produced from the terminal T as the signal current.

In the construction of the present invention as described above, no blocking diode is required for the prevention of cross talk, while by the adoption of the matrix wirings, switching elements may be reduced to a large extent, and thus, not only the production of the elements is facilitated, but cost reduction may be achieved simultaneously.

The photoelectric converting film to be prepared in the embodiment according to the present invention shows an extremely high photoconductivity and, for example, the CdSe group photoelectric converting film has a bright/dark ratio higher than $10^3$ during light irradiation at 695 nm, 30 Lx to provide a signal larger than 1 $\mu$A as light current, thus making it possible to produce the contact type one-dimensional image sensor which employs a real time type read-out system. The photoelectric converting film of the present invention is also superior in the light response characteristics and shows a quick response at less than 5 ms both for rising (90%) and falling (90%), which is extremely desirable as a high speed reading element. Moreover, since the light receiving element is completely sealed by the organic insulative resin film, alteration of the element characteristics due to variation in circumstances is also very small.

Furthermore, the photoelectric converting film for the element to be manufactured according to the present invention can be prepared by processing a paste of a photoconductive material through a screen printing, while the organic insulating layer may also be formed by an application step, and thus a favorable mass-productivity is achieved.

Subsequently, the manufacturing process of the element employing CdSe group photoelectric converting film will be described in more detail.

With employment of #7059 glass substrate (manufactured by Corning, U.S.A.) as an insulative substrate 1, the photoconductive paste was applied onto said substrate 1 by the screen printing process, and after drying by hot air at 100° C. for 1 hour, subjected to heat treatment at 300° C. for 15 minutes, and then, at 500° C. for 30 minutes in an atmosphere of $N_2$, and thus, a photoelectric converting film having a film thickness of about 4 $\mu$m was formed.

To prepare the photoconductive paste, 3 molar % of $CdCl_2$, 2% by weight of low melting point glass frit (Tg: 385° C.) with respect to a total amount, and a proper amount of oil (containing 1.5% by weight of ethyl cellulose) for viscosity adjustment were added to CdSe crystalline powder (Cu: 0.4 molar % doping, powder treated at 800° C. in $N_2$) preliminarily subjected to activating heat treatment and having an average particle diameter of about 2 $\mu$m, and the mixture thus prepared was mixed for about 50 hours in a ball mill.

On the photoelectric converting film 2 thus formed, confronting electrodes including the common electrodes 3 and individual electrodes 4 were formed by a lift-off process, with a simultaneous formation of the lower wiring 5. In the present embodiment, there was formed a light receiving element array with Ti of approximately 5000 Å thickness as the electrodes and wirings, with an interval between the electrodes of 50 $\mu$m and electrode length of 70 $\mu$m, and composed of 1728 picture elements. Over the entire surface of said light receiving element array, a polyimide resin layer 7 adapted to have a thickness of about 5 $\mu$m after curing was formed by the spin-coat process so as to serve as an insulating film and an element protective film. In order to provide the through-holes for the formation of the matrix wiring, the polyimide resin is first formed into a pattern in a half-cured state through employment of an ordinary photo-lithographic technique, and after application of a triple metallic layer of Al, Ti, Cu-Ni alloy thereover as the upper wiring material, the polyimide resin film was completely cured. For the above wiring pattern, an ordinary photographic technique was employed, and a matrix wiring having 32 elements as one block was formed.

Since the interlaminar insulating layer 6 for the matrix wiring portion is also simultaneously formed on the light receiving element portion after the lift-off process, such portion is not adversely affected in the step for forming the upper wiring, and thus, no deterioration is noticed in the characteristics of the photoelectric converting film.

The element prepared in the manner as described above was capable of reading signal currents of approximately 15 $\mu$A on average with respect to incident light of 30 Lx at a bias voltage of 12 V, and scattering in the output characteristics among the respective picture elements was favorable at ±15%. Meanwhile, with respect to the light response speed, superior response characteristics at 3.0 ms for the rising (90%) and 0.5 ms for the falling (90%) were achieved, and thus, a high speed contact type one-dimensional image sensor capable of reading by the real time reading system could be produced. Furthermore, upon effecting a reliability test of the above element under high temperature and humidity at 65° C. and 95% RH, favorable results were obtained with the characteristics variation within 5% even after 200 hours, and thus, it has been found that the polyimide resin layer formed on the photoelectric converting film fully accomplishes the function as the sealing film for the improved reliability of the element.

As is seen from the foregoing description, according to the method of manufacturing the contact type one-dimensional image sensor of the present invention, since the sealing of the light receiving element array is simultaneously effected in the matrix wiring forming step, the number of steps may be advantageously reduced, with superior mass-productivity. Therefore, according to the present invention, a high yield can be achieved in the manufacture of the elements, and thus, elements at high reliability may be produced at low cost.

Referring further to FIGS. 4 through 9, a contact type image sensor module substrate and a manufacturing method thereof for a second embodiment of the present invention will be described in detail hereinbelow.

Figure 4:
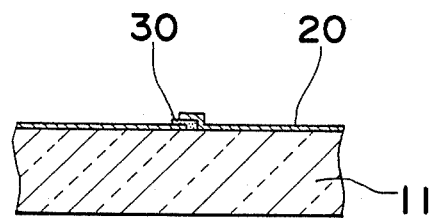
FIG. 4 is a fragmentary side sectional view showing one example of a sensor portion in a sandwiched form contact type image sensor module substrate.
Figure 5:
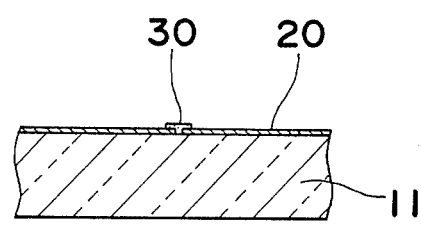
FIG. 5 is a fragmentary cross section of a sensor portion in a coplanar contact type image sensor module substrate in which the electrode is located below the photoconductor layer.
Figure 6:
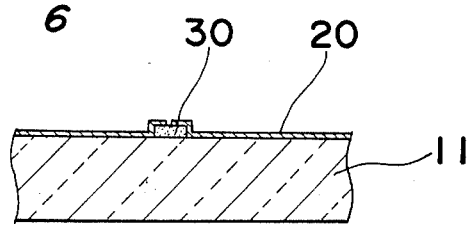
FIG. 6 is a fragmentary cross section of a sensor portion in a coplanar contact type image sensor module substrate in which the electrode is located above the photoconductor layer.

Commonly, the contact type image sensor module substrates may be broadly divided into a sandwiched type as shown in FIG. 4 in which the photoconductor layer 30 is sandwiched between electrodes 20 on the glass substrate 11, and a coplanar type which is further classified into one type in which the electrodes 20 are provided below the photoconductor layer 30 on the glass substrate 11 as in FIG. 5, and the other type in which the electrodes 20 are disposed on the photoconductor layer as shown in FIG. 6.

Figure 7:
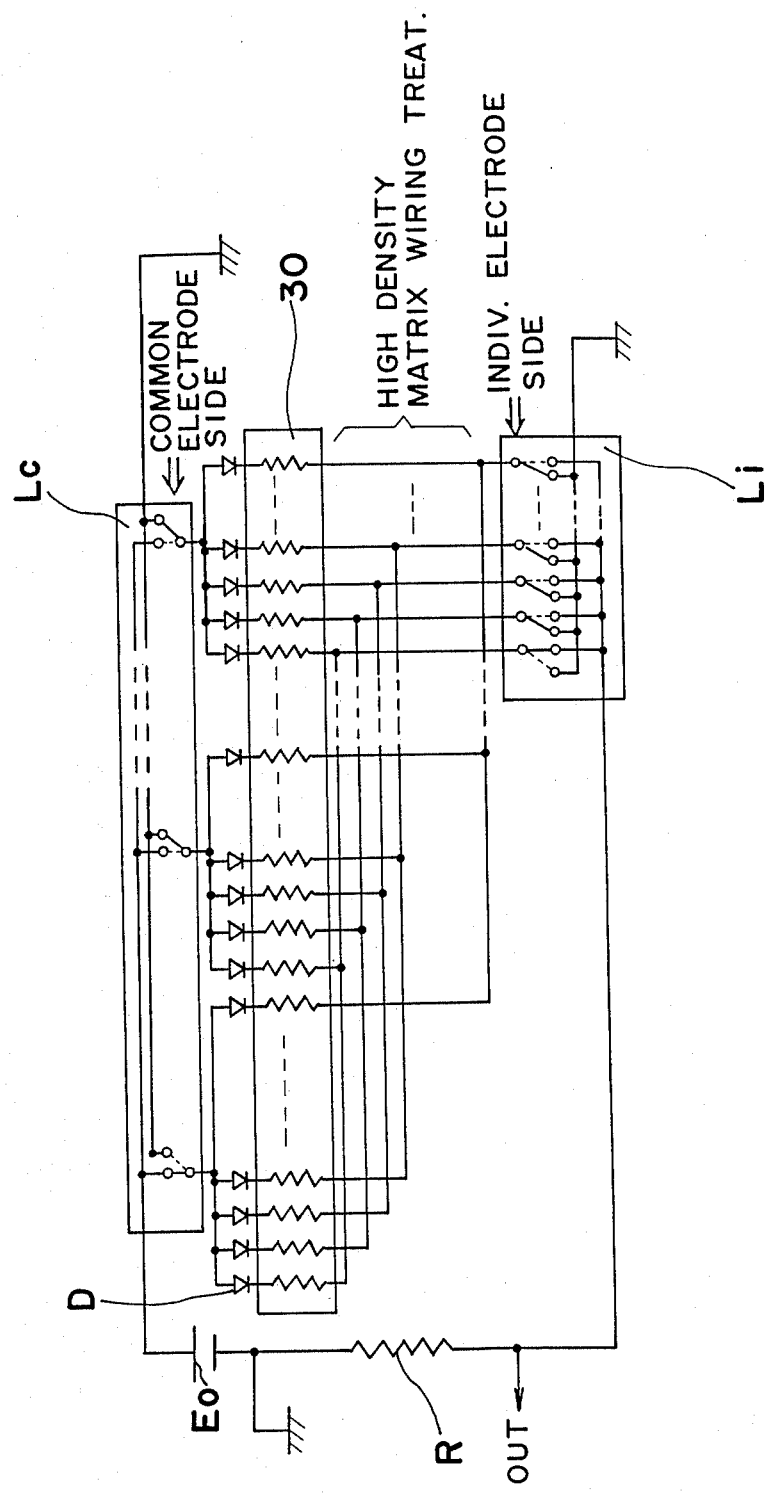
FIG. 7 is an electrical diagram showing one example of a reading circuit as classified by blocks in the substrate of the present invention.
Figure 8:
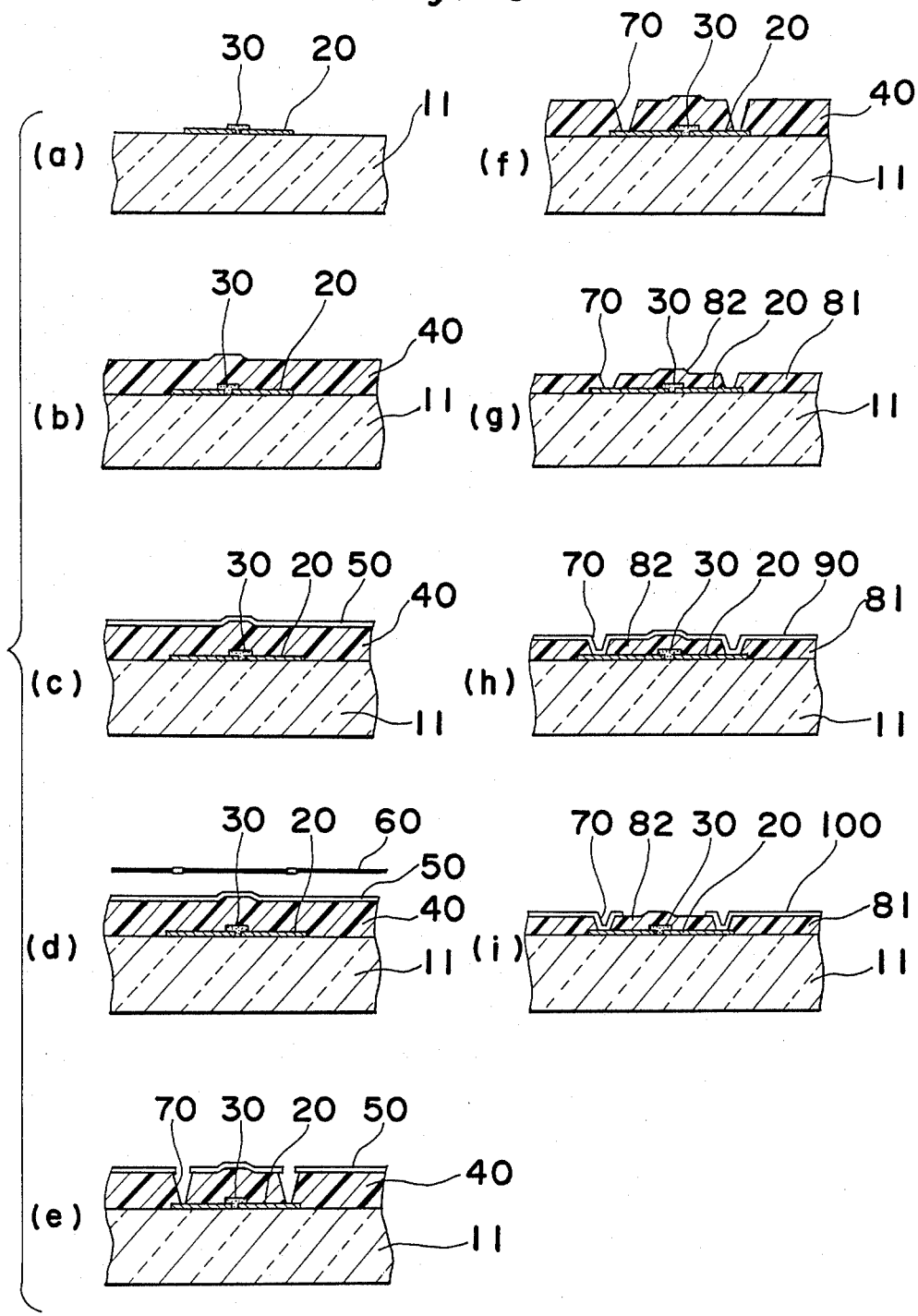
FIGS. 8(a) through 8(i) are fragmentary cross sectional views showing steps of forming the coplanar contact type image sensor module substrate according to one preferred embodiment of the present invention.

In general, in the sandwiched type, amorphous silicon is mainly employed for the photoconductor layer, and the substrate is characterized by its high light response speed, but has the disadvantage that the manufacturing process thereof is complicated, resulting in high cost. Meanwhile, the coplanar type is simple in the manufacturing steps and consequently, less expensive, but it is considered to be inferior to the former in the light response speed. In the substrate of any of the above described types, the photoconductor layer itself is an element very sensitive to the external circumstances, and therefore, it is necessary to apply thereto a passivation layer having resistance against chemicals and environmental circumstances. Moreover, for the electrodes 20 of the photoconductor portion, 1728 lines or 3456 lines (respectively in the cases of 8 lines/mm and 16 lines/mm) are required for A4 size, and how to read signals to be obtained from these electrodes presents another problems. In order to cope with such a situation, it has been a general practice to divide the reading circuit into blocks (i.e., to form into the multi-layer wirings), thereby to decrease the number of LSI for cost reduction (matrix wiring) as shown in FIG. 7, in which the photoconductor layer as represented by numeral 30 is coupled to the common electrode side LSI (driving circuit) Lc and individual electrode side LSI (driving circuit) Li by the wirings as illustrated, with blocking diodes being denoted by a symbol D, and with a DC power source E0 and a load resistance R being inserted in series in line connecting LSI circuits Lc and Li.

The method of manufacturing the contact type image sensor module substrate according to the second embodiment of the present invention as referred to above includes the steps of forming a photoconductor layer and a lower wiring on a substrate, coating an insulating layer between an upper wiring and the lower wiring, with said insulating layer being retained at a semi-cured state, etching said insulating layer in said state to effect a via-hole formation, effecting complete curing of said insulating layer, and subsequently, forming an upper wiring on said insulating layer so as to establish contact with said lower wiring through said via-holes.

By the above steps, an image sensor module substrate superior in reliability may be produced at low cost. More specifically, in the second embodiment of the present invention, there is prepared the coplanar image sensor module substrate in which the multi-layer matrix wirings are formed by the insulating layer (to be commonly used as the passivation film of the photoconductor) employing polyimide subjected to a via-hole formation based on a polyimide semi-cure etching process (i.e., an etching process in which polyimide is retained in a semi-cured state for subsequent etching).

Subsequently, the steps for the method of forming the coplanar contact type image sensor module substrate according to the present invention will be explained with reference to the embodiment.

Figure 9:
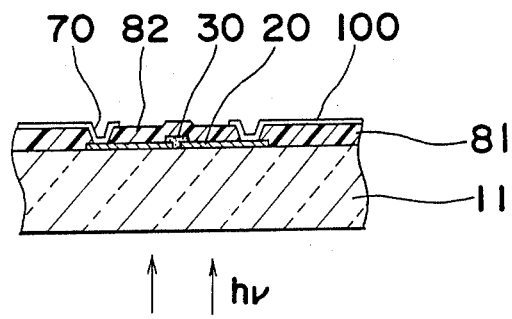
FIG. 9 is a fragmentary cross section showing construction of the coplanar contact type image sensor module substrate to be formed according to the steps of FIGS. 8(a) through 8(i)

FIGS. 8(a) through 8(i) are diagrams showing the steps for forming the module substrate having the construction as shown in FIG. 9.

In the first step, as shown in FIG. 8(a), the lower wiring 20 and photoconductor (photoelectric converting element) layer 30 are formed on the glass substrate 11. Either of the lower wiring 20 or the photoconductor layer 30 may be formed beforehand, but in this embodiment, the lower wiring 20 is shown as having been formed first.

Then, as illustrated in FIG. 8(b), the polyimide resin layer 40 is coated on the substrate 11 to cover the photoconductive layer 30 and the lower wiring 20 for semi-curing at 140° C.

Subsequently, as shown in FIG. 8(c), a naphthoquinone group positive type photoresist layer 50 (e.g. AZ resist layer) is coated over the polyimide resin layer 40 for pre-baking.

Thereafter, as illustrated in FIG. 8(d), exposure is effected through employment of a photo-mask 60 in which the via-hole portion to be formed is made transparent, and a portion on the photoconductor layer 30 is rendered opaque for leaving the insulating layer as the passivation film.

In the next step, as shown in FIG. 8(e), the photoresist 50 is subjected to development through employment of a tetramethylammonium hydroxide group developing solution. In the above case, since the developing solution is of strong alkali, etching of the polyimide layer 40 is effected simultaneously with the development of the photo-resist 50 so as to form the via-holes 70.

Then, as shown in FIG. 8(f), the photo-resist layer 50 is removed.

Subsequently, as illustrated in FIG. 8(g), the polyimide layer 40 is completely cured, and thus, an insulating layer 81 over the lower wiring, and a protective layer 82 for the photoconductor layer 30 which are made of the completely cured polyimide are formed.

The protective film 82 is an insulating film which functions as a covering film for the photoconductor layer 30 during processing and also as a protective film resistant against circumstances or environmental conditions (passivation film).

Thereafter, depending on necessity, as shown in FIG. 8(h), the polyimide layers 81 and 82 are subjected to a surface treatment by a dry process such as plasma etching, reverse sputtering, etc. for an improved contact between the polyimide layers 81 or 82 and the upper wiring 100 (FIG. 8(i)), and then, the upper wiring film 90 is formed by sputtering.

Finally, as shown in FIG. 8(i), the upper wiring 100 is formed by patterning (matrix wiring) the upper wiring film 90.

By the steps as described so far, the contact type image sensor module substrate as shown in FIG. 9 is formed.

Through adoption of the foregoing manufacturing method according to the present invention, favorable effects as follows may be obtained.

(i) Owing to the employment of the semi-cured polyimide etching process, it becomes possible to prepare an improved contact type image sensor module substrate through facilitated manufacturing steps and at low cost.

(ii) The polyimide film functions not only as the insulating layer in the multi-layer wirings, but also as a covering of the photoconductor portion (which prevents the photoconductor portion from being damaged by chemicals, etc. in the process after formation of the photoconductor), and further, as a passivation layer resistant to environmental conditions at the photoconductor portion.

Figure 10:
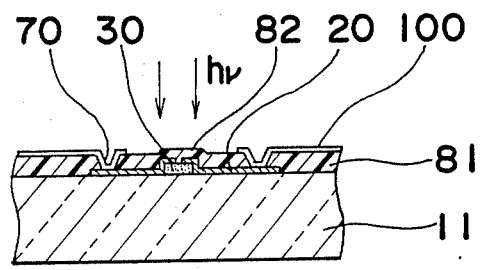
FIG. 10 is a view similar to FIG. 9, which particularly shows another construction thereof.

(iii) The polyimide film itself allows light rays having wavelengths larger than 500 nm to fully transmit therethrough. Accordingly, the concept of the present invention is not limited in its application to the formation of the module substrate in the case where the electrode is disposed below the photoconductor as in the embodiment, but may also be applied to the formation of an image sensor module substrate of the type as shown in FIG. 10 in which the electrode 20 configuration requiring light irradiation (hν) from the upper part of the substrate is provided above the photoconductor 30, through similar steps as in the embodiment of FIGS. 8 and 9.

As is clear from the foregoing description, according to the present invention, it has become possible to produce the image sensor module substrate superior in reliability through simple steps at low cost.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A method of manufacturing a contact type one-dimensional image sensor comprising the steps of:
   providing on a substrate a light receiving element portion composed of at least one Group II-VI compound semiconductor containing Cd;
   providing a matrix wiring portion on the same substrate in communication with said light receiving element portion; and
   forming an insulating layer over said substrate and said matrix wiring portion in such a manner as to also cover said light receiving element portion.

2. A method as claimed in claim 1, wherein said light receiving element portion is formed by the steps of:
   applying onto the substrate, a material in a paste-like form prepared by adding a powder of said compound semiconductor, one or more kinds of a halogen compound of Cd as a flux and/or a low melting point glass frit dispersed in an organic binder; and
   subjecting said material to a heat treatment in an inert gas atmosphere at temperatures of 400° to 600° C.

3. A method as claimed in claim 1, wherein said insulating layer comprises a polymer film.

4. A method as claimed in claim 1, wherein said light receiving element portion includes an electrode portion continuously formed with a lower layer electrode portion of said matrix wiring portion.

5. The method as claimed in claim 1 further comprising the step of:
   forming another matrix wiring portion over said insulating layer.

6. The method as claimed in claim 5, wherein said matrix wiring portions are interconnected through via-holes etched in said insulating layer.

7. The method as claimed in claim 6, wherein said insulating layer protects said light receiving element portion from damage during etching.

8. The method as claimed in claim 1, wherein said matrix wiring portion is in contact with said light receiving element portion.

9. A method of forming a coplanar contact type image sensor module substrate comprising the steps of:
   forming a photoconductor layer and a lower wiring on a substrate;
   coating an insulating layer over the lower wiring, with said insulating layer being retained at a semi-cured state;
   etching said insulating layer in said semi-cured state to effect a via-hole formation;
   subsequently completing the curing of said insulating layer; and
   forming an upper wiring on said insulating layer so as to establish contact with said lower wiring through said via-holes.

* * * * *